United States Patent
Craninckx

(10) Patent No.: US 7,298,809 B2
(45) Date of Patent: Nov. 20, 2007

(54) SELF-CALIBRATION OF A PLL WITH MULTIPHASE CLOCKS

(75) Inventor: Jan Frans Lucien Craninckx, Boutersem (BE)

(73) Assignee: STMicroelectronics Belgium N.V., Zaventem (BE)

( * ) Notice: Subject to any disclaimer, the term of this patent is extended or adjusted under 35 U.S.C. 154(b) by 697 days.

(21) Appl. No.: 10/718,257

(22) Filed: Nov. 20, 2003

(65) Prior Publication Data

US 2004/0157577 A1 Aug. 12, 2004

(30) Foreign Application Priority Data

Nov. 21, 2002 (EP) ................................ 02447227

(51) Int. Cl.
*H03D 3/24* (2006.01)
(52) U.S. Cl. ..................................... 375/376
(58) Field of Classification Search ................ 375/354, 375/371, 373, 374, 375, 376, 316, 322, 324, 375/327; 329/304, 306, 307; 332/117, 123, 332/126, 127; 342/73, 89, 98, 100, 102, 342/103
See application file for complete search history.

(56) References Cited

U.S. PATENT DOCUMENTS 6,181,213 B1 1/2001 Chang

FOREIGN PATENT DOCUMENTS

WO   WO 02/27938   4/2002

OTHER PUBLICATIONS

Chan-Hong Park et al, "A 1.8-Ghz Self-Calibrated Phase-Locked Loop with Precise I/Q Matching", IEEE Journal of Solid-State Circuits, vol. 36, No. 5, May 2001, pp. 777-783, XP002241677.
S. Khursheed Enam et al., "NMOS IC's for Clock and Data Regeneration in Gigabit-per-Second Optical-Fiber Receivers", IEEE Journal of Solid-State Circuits, vol. 27, No. 12, Dec. 1992, pp. 1763-1774, XP000329026.
European Search Report dated May 20, 2003 for European Application No. 02-447227.6.

*Primary Examiner*—Pankaj Kumar
(74) *Attorney, Agent, or Firm*—Lisa K. Jorgenson; Stephen Bongini; Fleit Kain Gibbons Cutman Bongini & Bianco P.L.

(57) ABSTRACT

A Phase-Locked Loop with multiphase clocks is provided. The Phase-Locked Loop includes a main loop, a calibration loop, and a Demultiplexer. The main loop includes, coupled in series, a Phase Frequency Detector, a Main Charge Pump, a Main Loop Filter, a Multi-Phase Voltage Controlled Oscillator and a Phase-switching Fractional Divider. The calibration loop includes Y Calibration Loop Filters, with Y being an integer, coupled to the Multi-Phase Voltage Controlled Oscillator, and Control Logic for controlling the Phase-Switching Fractional Divider. The Demultiplexer is coupled between an output of the Main Charge Pump and inputs of the Main Loop Filter and the Y Calibration Loop Filters. A Reference Frequency Signal is coupled to the Phase Frequency Detector, a control signal from the Control Logic is coupled to the Demultiplexer, and a Calibration Signal is coupled to a control input of the Control Logic.

10 Claims, 1 Drawing Sheet

SELF-CALIBRATION OF A PLL WITH MULTIPHASE CLOCKS

CROSS-REFERENCE TO RELATED APPLICATIONS

This application is based upon and claims priority from European Patent Application No. 02-447227.6, filed Nov. 21, 2002, the entire disclosure of which is herein incorporated by reference.

FIELD OF THE INVENTION

The present invention is related to a fractional-N frequency synthesizer used in digital communication systems. More precisely, it relates to a frequency synthesizer based on a Phase-Locked Loop (PLL) with multiphase clocks, in which a self-calibrating loop is used.

BACKGROUND OF THE INVENTION

In many applications, e.g., in mobile radio systems, it is necessary to synthesize frequencies in a digital way, i.e., using a Phase-Locked Loop. A conventional integer-N frequency synthesizer produces an output frequency that is N times the input reference frequency, such that its frequency resolution is the same as the PLL reference frequency. Therefore, narrow channel spacing is accompanied by a small loop bandwidth, which leads to long settling times. With a fractional-N frequency synthesizer, an output frequency is generated that is N+X/Y times the input reference frequency, i.e., a fractional multiple of the reference frequency, such that narrow channel spacing is achieved along with a higher phase detector frequency. If Y is not too big the fractional-N frequency synthesizer can be based on multiphase clock signals. The Voltage Controlled Oscillator (VCO) then disposes of Y copies of the signal, each shifted over $2\pi/Y$. The value of X then determines at which instances a VCO output pulse is generated.

Several major drawbacks arise from this approach. A mismatch between the various clock signal phases causes reduced quadrature accuracy, if the phases are used in an image-reject transceiver. Further, when the PLL is locked, the delay mismatches introduce periodic phase errors that give rise to fractional spurs in the output frequency spectrum, resulting in an out-of-spec transmitter spectrum and in a reduced interference capability in the receiver. A solution to this problem is suggested in IEEE JSSC, Vol. 36, No. 5, May 2001, pp. 777-783. It consists in adding to the PLL a self-calibrating loop to eliminate the delay mismatches. The calibration loop adjusts the phases of the multiphase clock signal based on the timing information present in the phase frequency detector (PFD) outputs. The calibration loop has a much smaller bandwidth in order to avoid disturbance of the locking behavior of the main loop. A safe solution here is to activate the calibration loop only when the main loop is locked. In the calibration loop there is a multiplexing switch that guides the current coming out of the calibration charge pump towards one of the Y calibration loop filters. Which one of the Y calibration loop filters is to be selected is determined by a control logic that knows which phase is currently selected by the phase-switching fractional divider and thus knows which phase must be calibrated.

Still the problem remains that a mismatch between the main charge pump of the original loop and the calibration charge pump of the calibration loop will result in an incorrect compensation of the phase errors. Therefore, the quadrature accuracy is still not yet correct and the fractional spurs are not completely removed.

SUMMARY OF THE INVENTION

In view of these drawbacks, it is an object of the present invention to overcome the above-mentioned drawbacks and to provide a device that synthesizes a fractional-N frequency based on a Phase-Locked Loop (PLL) with multiphase clocks, in which a self-calibrating loop is used in such a way that mismatch problems between the two charge pumps are avoided.

One embodiment of the present invention provides a Phase-Locked Loop with multiphase clocks. The Phase-Locked Loop includes a main loop, a calibration loop, and a Demultiplexer. The main loop includes, coupled in series, a Phase Frequency Detector, a Main Charge Pump, a Main Loop Filter, a Multi-Phase Voltage Controlled Oscillator and a Phase-switching Fractional Divider. The calibration loop includes Y Calibration Loop Filters, with Y being an integer, coupled to the Multi-Phase Voltage Controlled Oscillator, and Control Logic for controlling the Phase-Switching Fractional Divider. The Demultiplexer is coupled between an output of the Main Charge Pump and inputs of the Main Loop Filter and the Y Calibration Loop Filters. A Reference Frequency Signal is coupled to the Phase Frequency Detector, a control signal from the Control Logic is coupled to the Demultiplexer, and a Calibration Signal is coupled to a control input of the Control Logic.

Another embodiment of the present invention provides method for synthesizing frequencies with such a Phase-Locked Loop with multiphase clocks. According to the method, at least one such Phase-Locked Loop is provided. A reference frequency signal is coupled to the Phase Frequency Detector of the Phase-Locked Loop, and a Calibration Signal is coupled to the Control Logic of the Phase-Locked Loop.

According to a first preferred embodiment of the present invention, the PLL is part of a fractional-N frequency synthesizer.

According to a second preferred embodiment of the present invention, the PLL is part of an integrated circuit.

In one advantageous embodiment, the PLL is part of a digital mobile radio communication system.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention relate to a Phase-Locked Loop (PLL) with multiphase clocks, in which a self-calibrating loop is used. In order to avoid any mismatch problems between the main charge pump of the original loop and the calibration charge pump of the calibration loop, the same main charge pump is used for both loops.

Figure 1:
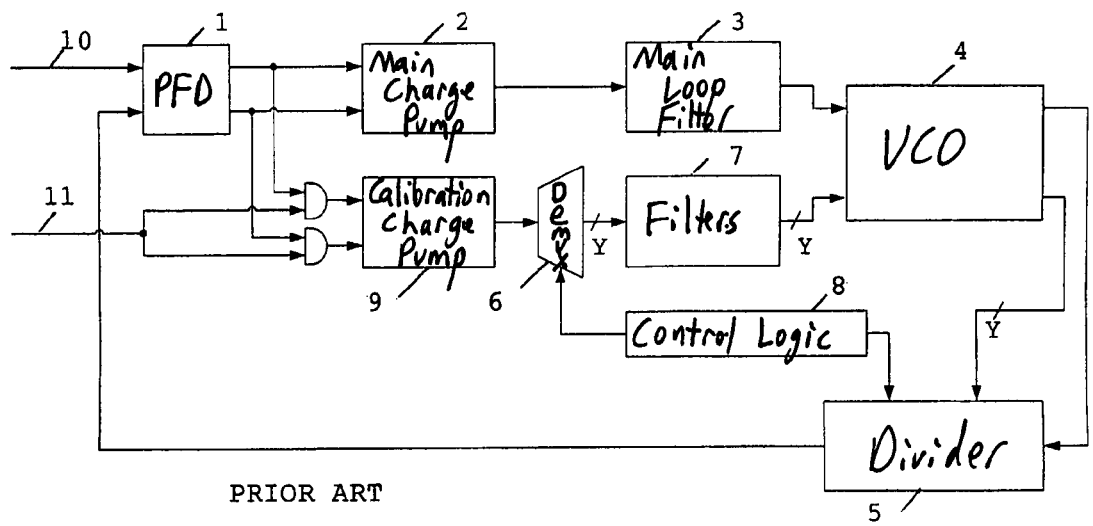
FIG. 1 represents the prior art solution.

The prior art solution is depicted in FIG. 1. As shown, a first (Main) loop comprises, coupled in cascade, a Phase Frequency Detector (PFD) 1, a Main Charge Pump 2, a Main Loop Filter 3, a Multi-Phase Voltage Controlled Oscillator (VCO) 4 and a Phase-switching Fractional Divider 5. A second (Calibration) loop comprises the series connection of a Calibration Charge Pump 9, a Demultiplexer 6 and Y Calibration Loop Filters 7, with Y being an integer, coupled between the Phase Frequency Detector (PFD) 1 and the Multi-Phase Voltage Controlled Oscillator (VCO) 4. The Demultiplexer 6 is controlled by Control Logic 8 coupled to the Phase-Switching Fractional Divider 5. A Reference Frequency Signal 10 is applied to the Phase Frequency Detector 1. The Calibration signal 11 is applied to a control input of the Control Logic 8.

Figure 2:
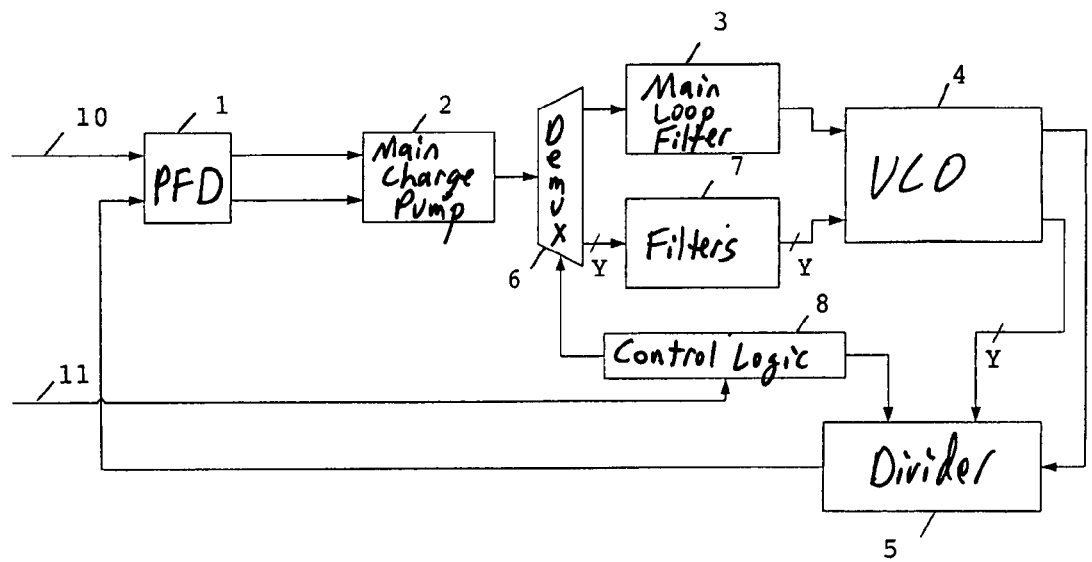
FIG. 2 represents one embodiment of the present invention.

FIG. 2 represents one embodiment of the present invention. In this device, the control logic 8 controls the demultiplexer 6 in such a way that most of the time the main loop filter is chosen and sometimes one of the calibration loop filters-is chosen. Most of the cycles of this charge pump are indeed used for the main loop, which has the highest bandwidth. In this state, demultiplexer 6 is just a through connection. However, from time to time, a cycle of the charge pump current is taken from the main loop and used for the calibration loop. When this occurs, the demultiplexer 6 guides the current towards one of the filters 7. Which filter exactly is chosen is determined by the state that the phase-switching fractional divider is in.

FIG. 2 shows the two loops in the system. A first (Main) loop comprises, coupled in cascade, a Phase Frequency Detector (PFD) 1, a Main Charge Pump 2, a Main Loop Filter 3, a Multi-Phase Voltage Controlled Oscillator (VCO) 4 and a Phase-switching Fractional Divider 5. A second loop (Calibration) comprises the series connection of a Demultiplexer 6 and Y Calibration Loop Filters 7, with Y being an integer, coupled between the Phase Frequency Detector (PFD) 1 and the Multi-Phase Voltage Controlled Oscillator (VCO) 4. The demultiplexer 6 is controlled by Control Logic 8 coupled to the Phase-Switching Fractional Divider 5, and a Reference Frequency Signal 10 is applied to the Phase Frequency Detector 1.

The demultiplexer 6 has an input connected to an output of the Main Charge Pump 2, and has outputs connected to inputs of the Main Loop Filter 3 and of Y Calibration Loop Filters 7. The Calibration signal 11 is applied to a control input of the Control Logic 8.

A practical example might be that, for Y=8, one out of nine cycles is used for calibration.

Suppose we want to divide by N+⅛. In this case the phase switching divider output is subsequently aligned with phase 1-2-3-4-5-6-7-8-1-2-3-4- and so on. The demultiplexer sequence shown in the left side of the table below can be used, where M denotes the main loop and Cx calibration loop x, with x=1 to 8.

Suppose we want to obtain a division by N+⅖. Then the phase switching divider output is subsequently aligned with phase 1-3-5-7-1-3-5-7-1-3- and so on. This leads to the demultiplexer sequence shown in the right side of the table below.

| N + 1/8 | | | N + 2/8 | | |
|---|---|---|---|---|---|
| index | phase | loop | index | phase | loop |
| 1 | 1 | M | 1 | 1 | M |
| 2 | 2 | M | 2 | 3 | M |
| 3 | 3 | M | 3 | 5 | M |
| 4 | 4 | M | 4 | 7 | M |
| 5 | 5 | M | 5 | 1 | M |
| 6 | 6 | M | 6 | 3 | M |
| 7 | 7 | M | 7 | 5 | M |
| 8 | 8 | M | 8 | 7 | M |
| 9 | 1 | C1 | 9 | 1 | C1 |
| 10 | 2 | M | 10 | 3 | M |
| 11 | 3 | M | 11 | 5 | M |
| 12 | 4 | M | 12 | 7 | M |
| 13 | 5 | M | 13 | 1 | M |
| 14 | 6 | M | 14 | 3 | M |
| 15 | 7 | M | 15 | 5 | M |
| 16 | 8 | M | 16 | 7 | M |
| 17 | 1 | M | 17 | 1 | M |
| 18 | 2 | C2 | 18 | 3 | C3 |
| 19 | 3 | M | 19 | 5 | M |
| . | | | | | |
| . | | | | | |
| . | | | | | |

The PLL described above can advantageously be applied in a fractional-N frequency synthesizer. In this way the spurious problems are completely removed and, moreover, the result no longer relies on accurate matching of components. Further, the I/Q accuracy is greatly improved.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A Phase-Locked Loop with multiphase clocks for use in a digital system, said Phase-Locked Loop comprising:

a main loop comprising, coupled in series, a Phase Frequency Detector, a Main Charge Pump, a Main Loop Filter, a Multi-Phase Voltage Controlled Oscillator and a Phase-switching Fractional Divider;

a calibration loop comprising Y Calibration Loop Filters, with Y being an integer, coupled to the Multi-Phase Voltage Controlled Oscillator, and Control Logic for controlling the Phase-Switching Fractional Divider; and a Demultiplexer coupled between an output of the Main Charge Pump and inputs of the Main Loop Filter and the Y Calibration Loop Filters, wherein the Phase Frequency Detector includes an input for receiving a Reference Frequency Signal, the Demultiplexer includes an input for receiving a control signal from the Control Logic, and the Control Logic includes a control input for receiving a Calibration Signal.

2. A fractional-N frequency synthesizer comprising the Phase-Locked Loop according to claim 1.

3. An integrated circuit comprising at least one Phase-Locked Loop according to claim 1.

4. A digital mobile radio communication apparatus including at least one Phase-Locked Loop with multiphase clocks, said Phase-Locked Loop comprising:
   a main loop comprising, coupled in series, a Phase Frequency Detector, a Main Charge Pump, a Main Loop Filter, a Multi-Phase Voltage Controlled Oscillator and a Phase-switching Fractional Divider;
   a calibration loop comprising Y Calibration Loop Filters, with Y being an integer, coupled to the Multi-Phase Voltage Controlled Oscillator, and Control Logic for controlling the Phase-Switching Fractional Divider; and
   a Demultiplexer coupled between an output of the Main Charge Pump and inputs of the Main Loop Filter and the Y Calibration Loop Filters,
   wherein the Phase Frequency Detector includes an input for receiving a Reference Frequency Signal,
   the Demultiplexer includes an input for receiving a control signal from the Control Logic, and
   the Control Logic includes a control input for receiving a Calibration Signal.

5. The digital mobile radio communication apparatus according to claim 4, further including at least one fractional-N frequency synthesizer that comprises said Phase-Locked Loop.

6. The digital mobile radio communication apparatus according to claim 4, further including at least one integrated circuit that comprises said Phase-Locked Loop.

7. A method for synthesizing frequencies in a digital system using a Phase-Locked Loop with multiphase clocks, said method comprising the steps of:
   providing at least one Phase-Locked Loop in the digital system, the Phase-Locked Loop including:
      a main loop comprising, coupled in series, a Phase Frequency Detector, a Main Charge Pump, a Main Loop Filter, a Multi-Phase Voltage Controlled Oscillator and a Phase-switching Fractional Divider;
      a calibration loop comprising Y Calibration Loop Filters, with Y being an integer, coupled to the Multi-Phase Voltage Controlled Oscillator, and Control Logic for controlling the Phase-Switching Fractional Divider; and
      a Demultiplexer coupled between an output of the Main Charge Pump and inputs of the Main Loop Filter and the Y Calibration Loop Filters; and
   synthesizing frequencies in the digital system using the Phase-Locked Loop by applying a reference frequency signal to the Phase Frequency Detector of the Phase-Locked Loop, and applying a Calibration Signal to the Control Logic of the Phase-Locked Loop.

8. The method according to claim 7, wherein a fractional-N frequency synthesizer comprises the Phase-Locked Loop.

9. The method according to claim 7, wherein an integrated circuit comprises the Phase-Locked Loop.

10. The method according to claim 7, wherein a digital mobile radio communication apparatus comprises the Phase-Locked Loop.

* * * * *